United States Patent [19]
Hsu

[11] Patent Number: 5,915,199
[45] Date of Patent: Jun. 22, 1999

[54] METHOD FOR MANUFACTURING A CMOS SELF-ALIGNED STRAPPED INTERCONNECTION

[75] Inventor: Sheng Teng Hsu, Camas, Wash.

[73] Assignees: Sharp Microelectronics Technology, Inc., Camas, Wash.; Sharp Kabushiki Kaisha, Osaka, Japan

[21] Appl. No.: 09/090,802

[22] Filed: Jun. 4, 1998

[51] Int. Cl.⁶ .............................................. H01L 21/4763
[52] U.S. Cl. ........................... 438/618; 438/647; 438/655
[58] Field of Search .................... 438/453, 618, 438/300, 303, 595, 598, 647, 649, 655

[56] References Cited

U.S. PATENT DOCUMENTS

| | | | |
|---|---|---|---|
| 4,592,927 | 6/1986 | Stall | 427/126.3 |
| 4,877,754 | 10/1989 | Peek | 438/587 |
| 5,039,622 | 8/1991 | Ishihara | 438/156 |
| 5,156,994 | 10/1992 | Moslehi | 438/647 |
| 5,183,770 | 2/1993 | Ayukawa et al. | 438/303 |
| 5,242,847 | 9/1993 | Ozturk et al. | 438/300 |
| 5,250,467 | 10/1993 | Somekh et al. | 438/643 |
| 5,432,104 | 7/1995 | Sato | 438/366 |
| 5,527,724 | 6/1996 | Brady et al. | 438/162 |
| 5,567,966 | 10/1996 | Hwang | 257/347 |
| 5,635,426 | 6/1997 | Hyashi et al. | 438/453 |

*Primary Examiner*—John F. Niebling
*Assistant Examiner*—Christopher Lattin
*Attorney, Agent, or Firm*—Gerald Maliszewski; David C. Ripma

[57] ABSTRACT

An CMOS interconnection method that permits small source/drain surface areas has been provided. The interconnection is applicable to both strap and via type connections. The surface areas of the small source/drain regions are extended into neighboring field oxide regions by forming a silicide film from the source/drain regions to the field oxide. Interconnections on the same metal level, or to another metal level are made by contact to the silicide covered field oxide. The source/drain regions need only be large enough to accept the silicide film. Transistors with small source/drain regions have smaller drain leakage currents and less parasitic capacitance. A CMOS transistor interconnection apparatus has also been provided.

19 Claims, 8 Drawing Sheets

METHOD FOR MANUFACTURING A CMOS SELF-ALIGNED STRAPPED INTERCONNECTION

BACKGROUND AND SUMMARY OF THE INVENTION

This patent relates generally to integrated circuit (IC) process technology and, more particularly, to a CMOS interconnection and method of interconnecting transistors that reduces the size of source/drain areas.

Leakage currents, parasitic capacitance, and switching speeds are all dependent on the size of the source/drain junction areas. To that end, research continues in the reduction of source/drain surface area and junction depth. Likewise, research continues to reduce the overall size of a transistor to increase transistor density in IC substrate.

Reducing the size of transistors is a goal dependent upon a number of factors. However, the necessity of interconnections between transistors, and between metal levels in an IC is at least one factor limiting size reduction. Connections to the source or drain of a transistor from another metal level are typically made with a via through an overlying interlevel dielectric. A metal, such as aluminum, fills the via to contact the underlying source or drain area. A trench or line intersects the via at the interlevel dielectric surface, and electrical communication is made from that line, through the via, to the transistor source/drain surface. Due to the resolution errors inherent in photolithographic masks, etching processes, and alignment, there are limits to how small a via diameter can only be made. Even a sub-micron sized via requires a relatively large source/drain surface area for electrical connection.

It would be advantageous if a transistor interconnection method could be devised that is not dependent on the surface area of the source/drain areas.

It would be advantageous if the interconnection between metal levels in an IC substrate was not made directly to the transistor source/drain regions.

It would be advantageous if the source and drain areas of a transistor could be reduced to minimize drain leakage current, without affecting connections to the source and drain regions.

Accordingly, a method is provided for forming interconnections from at least a first transistor with source/drain surface areas, through surrounding regions of field oxide. The method comprises the steps of:

a) depositing a semiconductor film, such as a silicon-germanium compound, over the transistor, including the source/drain surface areas and the surrounding field oxide regions;

b) depositing a refractory metal layer over the semiconductor film, including the source/drain regions and selected adjoining areas of field oxide; and c) annealing the semiconductor film and refractory metal to form a silicide film overlying the source/drain surface areas and the selected adjoining areas of field oxide. An electrical connection is made to the source/drain regions from the surrounding field oxide region.

Typically, the transistor includes a gate electrode with an underlying gate oxide layer, and first oxide sidewalls overlying portions of the source/drain region. Then, Step b) includes depositing a semiconductor film overlying the gate electrode and first oxide sidewalls. Before the refractory metal is deposited, a layer of insulation, such as oxide, is deposited over the first semiconductor film. This oxide layer is anisotropically etched to remove the oxide on the source/drain surface areas, gate electrode, and surrounding field oxide region. Because of the highly directional anisotropically etching process, oxide is not removed from the gate electrode sidewalls, so that a second sidewall is formed. Then, Step b) includes depositing refractory metal over the gate electrode and the second sidewalls. Step c) includes annealing the transistor to form a silicide film where the semiconductor film is exposed. A silicide film is, therefore, not formed on the second sidewalls.

After annealing, unreacted refractory metals, the second sidewalls, and the first semiconductor film overlying the first oxide sidewalls are removed. A dielectric interlevel is deposited over the transistor. Contact holes are etched through the dielectric interlevel to the silicide film overlying the selected areas of field oxide. Metal is deposited in the contact holes to form electrical interconnect between the transistor source/drain regions and the surface of the dielectric interlevel. In this manner, connections are made to the transistor without regard to the size of the source/drain surface areas.

In a similar manner, a strap interconnection is formed between the source/drain regions of a second transistor and the source/drain regions of a first transistor on the same metal level across a field oxide region. Step a) includes depositing a semiconductor film over both transistors. Step b) deposits refractory metal over the source/drain surface areas and selected areas of intervening field oxide. Steps c) anneals the semiconductor film and refractory metal to form a silicide film overlying the source/drain of the second transistor, the source/drain of the first transistor, and the selected areas of intervening field oxide. In this manner, electrical interconnections are made from the first transistor to the second transistor across the intervening field oxide. For example, the drain of the first transistor is connected to the source of the second transistor.

A CMOS interconnection and CMOS interconnection product by process are also provided. The CMOS interconnection comprises source/drain areas and field oxide regions surrounding the source/drain regions. The CMOS interconnection also comprises a gate electrode with first oxide sidewalls. A silicide film overlies the source/drain surface areas and selected adjoining field oxide regions. The silicide layer is formed by depositing a layer semiconductor film overlying the transistor and surrounding field oxide regions. Then, an insulator layer is deposited and anisotropically etched to form second gate electrode sidewalls. Refractory metal is deposited over the transistor and selected adjoining areas of field oxide and annealed to form a silicide film. Unreacted refractory metal, the second sidewalls, and the semiconductor film overlying the first oxide sidewalls are removed. Electrical connections can be made to the transistor source/drain surface areas through the silicide film overlying the field oxide selected areas.

DETAILED DESCRIPTION OF THE PREFERRED EMBODIMENT

Figure 1:
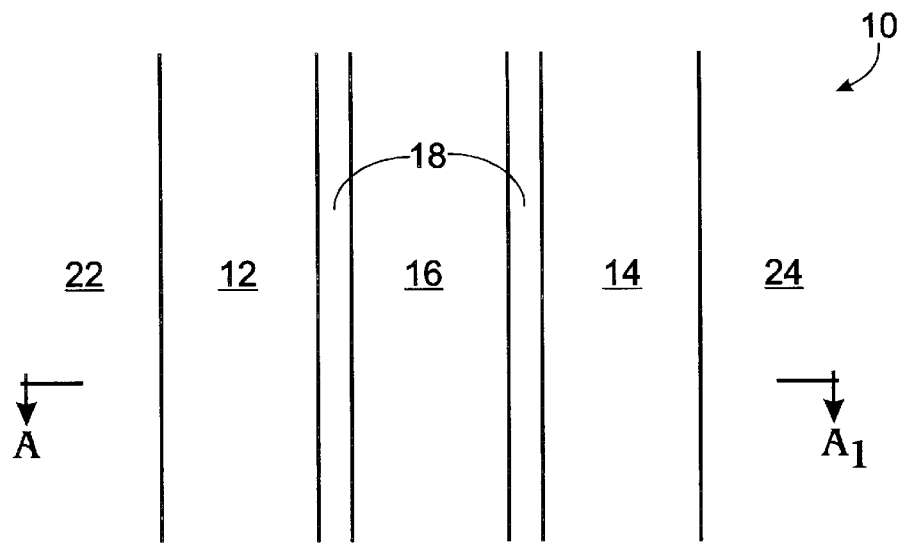
FIG. 1 is a plan view of a CMOS transistor (prior art).

FIG. 1 is a plan view of a CMOS transistor (prior art). Transistor 10 has a source with the top surface area 12, and a drain with the top surface area 14. Overlying portions of source 12 and drain 14 is a gate electrode 16. Gate electrode 16 has oxide sidewalls 18, and overlies a gate oxide layer 20. Transistor 10 is surrounded by field oxide regions 22 and 24.

Figure 2:
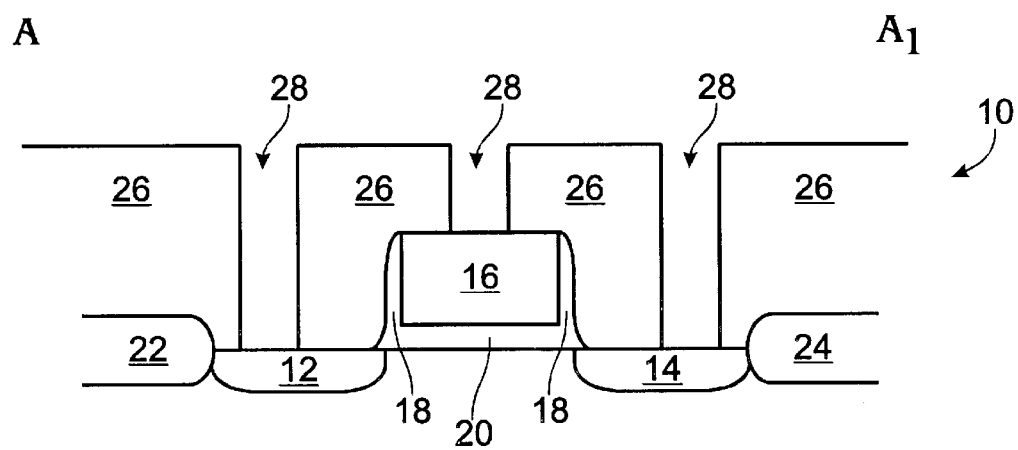
FIG. 2 is a partial cross-sectional view of the transistor of FIG. 1 (prior art).

FIG. 2 is a partial cross-sectional view of transistor 10 of FIG. 1 (prior art). A dielectric interlevel 26 overlies transistor 10 and field oxide regions 22 and 24. Vias 28 have been etched in dielectric interlevel 26 to access source 12, drain 14, and gate electrode 16. Vias 28 are filled with metal to make electrical connection between the transistor active areas and the surface of dielectric interlevel 26. From the surface of dielectric 26 lines and trenched make connections to other electrical components (not shown). The overall surface area of source/drain 12/14 must not be less than a minimum size to insure a via interconnection. In turn, the size of source/drain 12/14 results in at least a minimum drain leakage current and a minimum parasitic capacitance.

Figure 3:
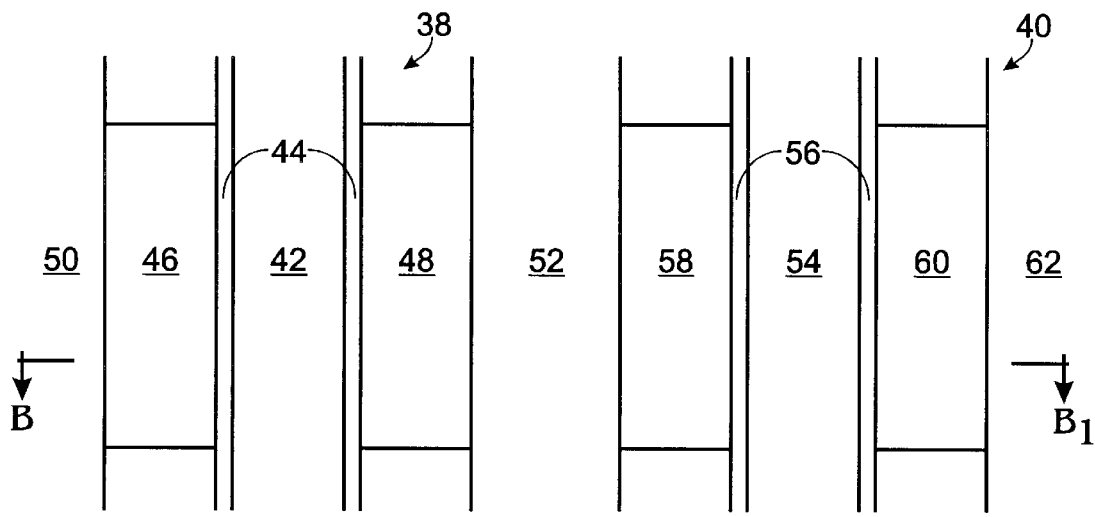
FIGS. 3 through 12 illustrate steps in the formation of a completed CMOS interconnection of the present invention.

FIGS. 3 through 12 illustrate steps in the formation of a completed CMOS interconnection of the present invention. FIG. 3 is a plan view of a first transistor 38 and a second neighboring transistor 40. The CMOS interconnection comprises a gate electrode 42 with first oxide sidewalls 44. First transistor 38 has an electrode 46, including underlying junction region which are subsequently formed into a source region. Likewise, electrode 48 is to be formed into a drain region. Alternately, region 48 is a source and region 46 is a drain. Generally, regions 46, 48, 58, and 60 are referred to herein as electrodes or source/drain regions. Field oxide regions 50 and 52 surround source/drain regions 46/48.

Second transistor 40 has a gate electrode 54 with first oxide sidewalls 56. Electrode 58 is a region to be formed into a source region, and electrode 60 is to be formed into a drain region. Alternately, electrode 58 is a drain and electrode 60 is a source. Field oxide regions 52 and 62 surround source/drain regions 58/60.

Figure 4:
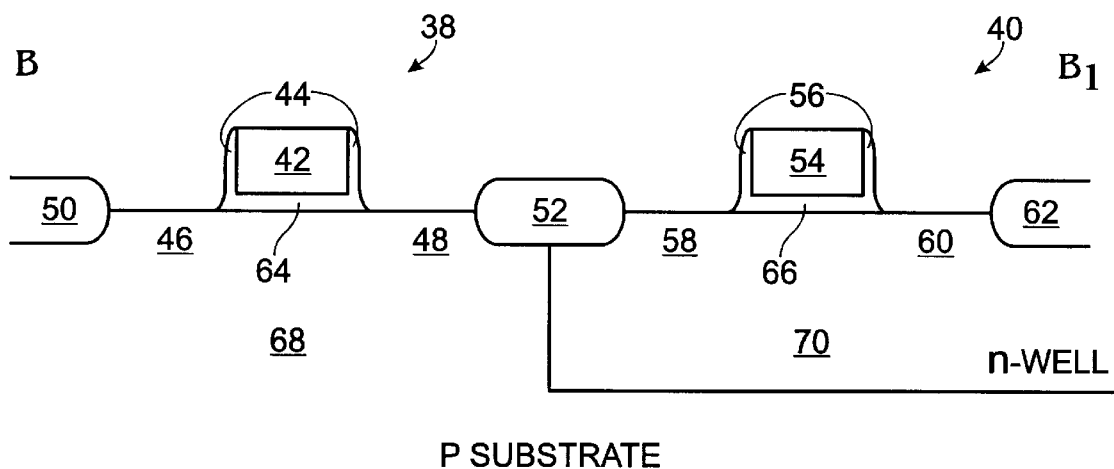

FIG. 4 is a partial cross-sectional view of transistors 38 and 40 of FIG. 3. Gate electrode 42 overlies a gate oxide layer 64 having a thickness on the order of 5 to 20 nanometers (nm). First transistor 38 is fabricated overlying a P-doped substrate 68. Second transistor 40 is fabricated overlying an N-well 70.

Interconnects are made with transistors 38 and 40 selected from the group consisting of bulk silicon, silicon on insulator (SOI), and raised source/drain the transistors. Conventional methods may be used to form well 70 with a threshold voltage adjustment ion implementation. Well 70 is formed from diffusion or retrograded high-energy ion implantation in different aspects of the invention. Field oxide regions 50, 52, and 62 are formed by the local oxidation of silicon LOCOS) or shallow trench isolation. When an SOI structure is used, the process of forming a doped well is replaced with a silicon island etch and threshold voltage adjustment ion implantation, as is well known in the art.

Typically, polysilicon is deposited through a vapor deposition process, and doped to form gate electrodes 42 and 54. The thickness of gate electrodes 42 and 54 is on the order of 200 to 500 nm.

Figure 5:
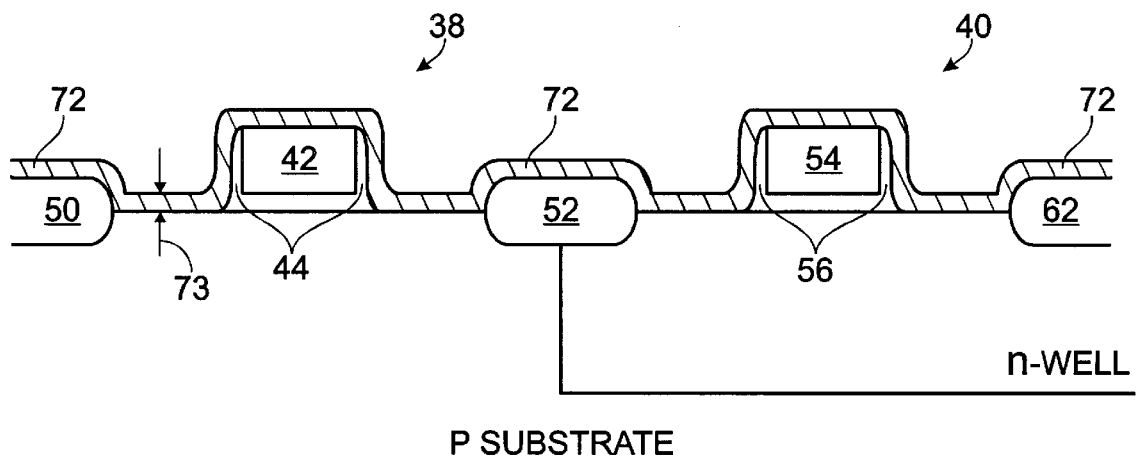

FIG. 5 depicts transistors 38 and 40 of FIG. 4 following the deposition of a layer of semiconductor film 72. Semiconductor film 72 overlies transistors 38 and 40, and surrounding field oxide regions 50, 52, and 62. For clarity, semiconductor film 72 is depicted with cross-hatched lines. Semiconductor film 72 is selected from the group consisting of polysilicon and silicon-germanium compounds $Si_xGe_{1-x}$. The (x) of the silicon-germanium compound ($Si_xGe_{1-x}$) is in the range between 0.5 and 0.9. Semiconductor film 72 has a thickness 73 in the range between 50 and 200 nm.

Figure 6:
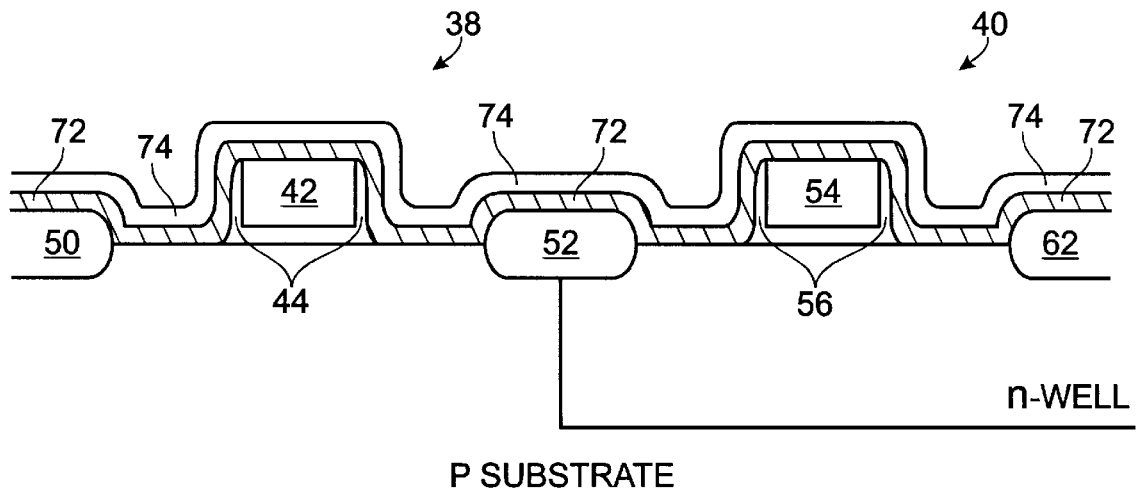

FIG. 6 depicts transistors 38 and 40 of FIG. 5 following the deposition of an insulating layer 74. Insulating layer 74 overlies semiconductor film 72. Insulating layer material 74 is selected from the group consisting of oxide and nitride. In some aspects of the invention (not shown), semiconductor film 72 is etched from the non-selected field oxide regions 50, 52, and 62 (the field oxide regions where a silicide film is not formed in subsequent steps).

Figure 7:
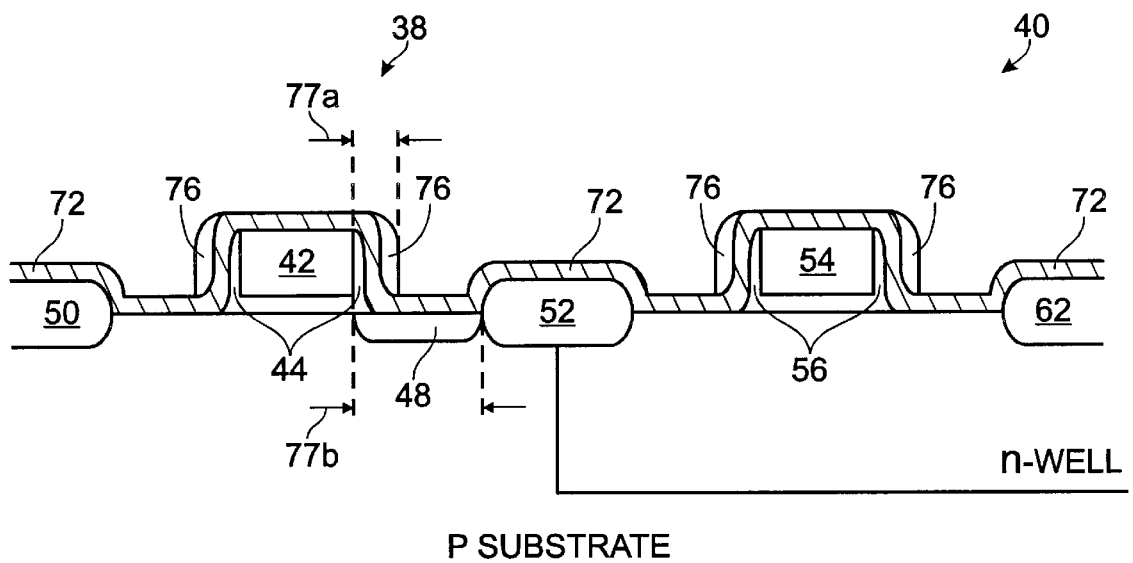

FIG. 7 depicts transistors 38 and 40 of FIG. 6 following an anisotropic etching of insulating layer 74. The anisotropic etch forms second gate electrode sidewalls 76. A plasma etch is suitable. First sidewall 44 (or 56), second sidewall 76, and intervening semiconductor film 72 have a combined sidewall thickness 77a.

At this point in the fabrication process, ion implantation occurs to form active source/drain regions associated with source/drain regions 46, 48, 58, and 60 (see FIG. 3). For clarity, only one electrode region 48 is depicted. For example, when first transistor 38 is an NMOS transistor, an N+ ion implantation is performed with arsenic, at energy levels between 30 and 60 keV, and doses from $5 \times 10^{14}$ to $4 \times 10^{15}/cm^2$. When second transistor 40 is an PMOS transistor an P+ ion implantation is performed with $BF_2$, at energy levels between 30 and 60 keV, and doses from $5 \times 10^{14}$ to $4 \times 10^{15}/cm^2$. Diffusion of the dopants occurs at a temperature in the range between 800 and 1000 degrees C, for a time in the range between 20 and 60 minutes. An NMOS and PMOS transistor are depicted, but the present invention is not limited to any particular transistor style. The resulting active source/drain regions have a source/drain width 77b approximately twice as wide as combined sidewall thickness 77a overlying source/drain region 48.

Figure 8:
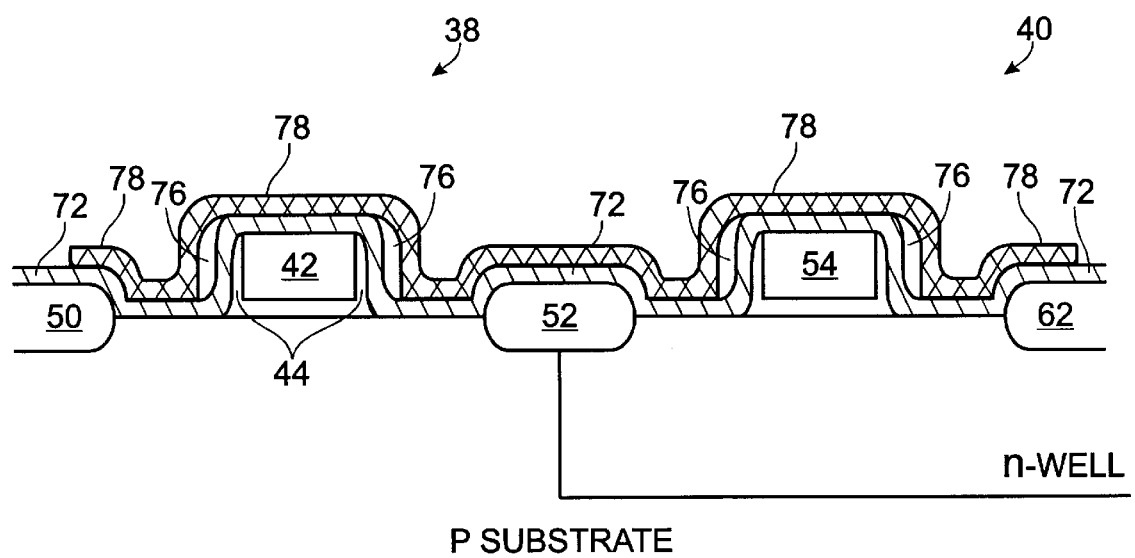

FIG. 8 depicts transistors 38 and 40 of the FIGS. 7 following the deposition of refractory metal layer 78. Refractory metal layer 78 is shown with double cross-hatched lines. Refractory metal layer 78 is deposited over semiconductor film 72, and covers semiconductor film 72 deposited on source/drains surface areas 46, 48, 58, and 60, and selected adjoining areas of field oxide 50, 52, and 62. Typically, refractory metal layer 78 is deposited isotropically over all surfaces. Then, a photoresist mask is placed to cover areas where refractory metal layer 78 is desired. The areas not covered by the mask, such as portions of field oxide regions 50 and a 62, have refractory metal layer 78 removed through an etching process. Refractory metal 78 is selected from the group consisting of Ti, Co, W, Pt, and Ni.

Figure 9:
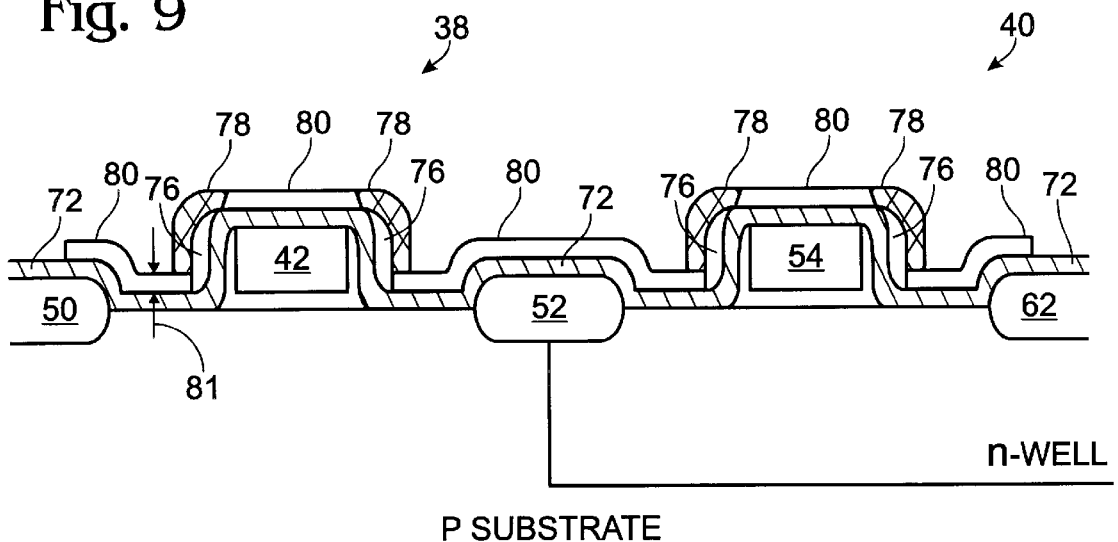

FIG. 9 depicts transistors 38 and 40 of FIG. 8 following annealing. Transistors 38 and 40 are annealed to form a silicide film 80. Silicide film 80 is formed in the areas where refractory metal layer 78 overlies semiconductor film 72 (see FIG. 8), over source/drain areas 46, 48, 58, and 60, selected areas of field oxide regions 50, 52, and 62, and gate electrodes 42 and 54. In areas where refractory metal layer 78 does not overlie semiconductor film 72, refractory metal layer 78 remains unreacted. Silicide film 80 has a resistivity in the range between 2 and 10 ohms per square (with conductivity remaining constant for the square of any dimension or unit system). Silicide film 80 has a thickness 81 in the range between 40 and 200 nm. In some aspects of the invention, the annealing includes two annealing sub-steps. The first Sub-step includes annealing at temperature in the range between 450 and 650 degrees C. The second Sub-step includes annealing at a temperature in the range between 700 and 900 degrees C. In some aspects of the invention, a layer of unreacted semiconductor film 72 underlies silicide film 80 after annealing. In other aspects of the invention, semiconductor film 72 is completely consumed in the annealing process (not shown). Silicide film 80 permits electrical communication from field oxide regions 50, 52, and 62 to source/drain regions 46, 48, 58, and 60.

Figure 10:
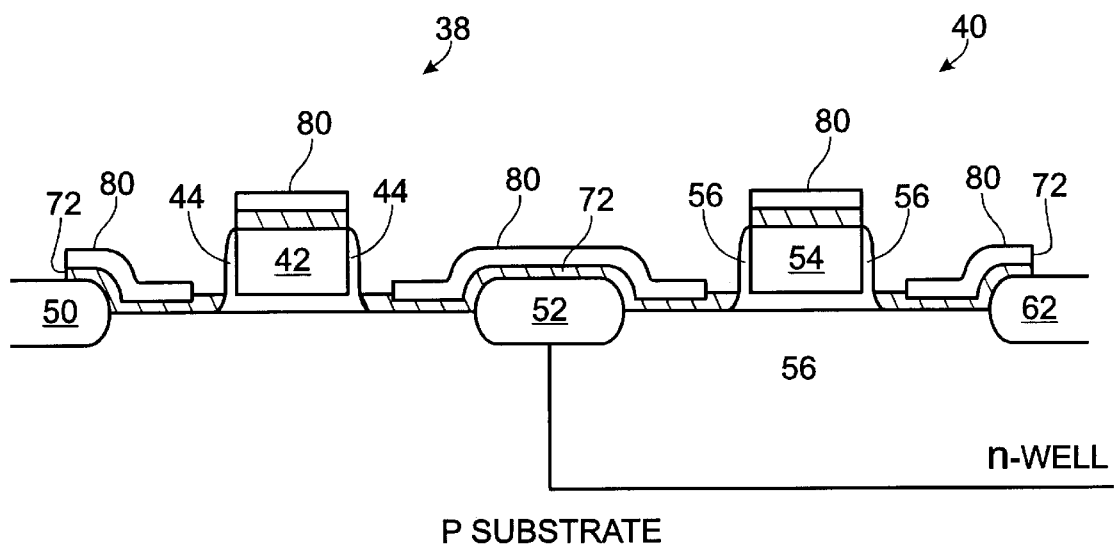

FIG. 10 depicts transistors 38 and 40 of FIG. 9 following etching processes. Unreacted refractory metal 78, second sidewalls 76, and unreacted semiconductor film 72 overlying first oxide sidewalls 44 and 56 are all removed. Typically, these three materials are removed in three separate etch processes. When insulator material 74 (see FIG. 6) and, therefore, second gate electrode sidewalls 76 are oxide, a buffered hydrofluoride (BHF) etch is used to remove second gate electrode sidewalls 76, and a $NH_3OH:H_2O_2:H_2O$ solution is used to remove semiconductor film 72. When insulator material 74 and, therefore, second gate electrode sidewalls 76 are nitride, phosphoric acid is used to remove second gate electrode sidewalls 76, and a $NH_3OH:H_2O_2:H_2O$ solution is used to remove semiconductor film 72. Electrical connections are made to source/drain regions 46, 48, 58, and 60 from selected areas of adjoining field oxide regions 50, 52, and 62.

Figure 11:
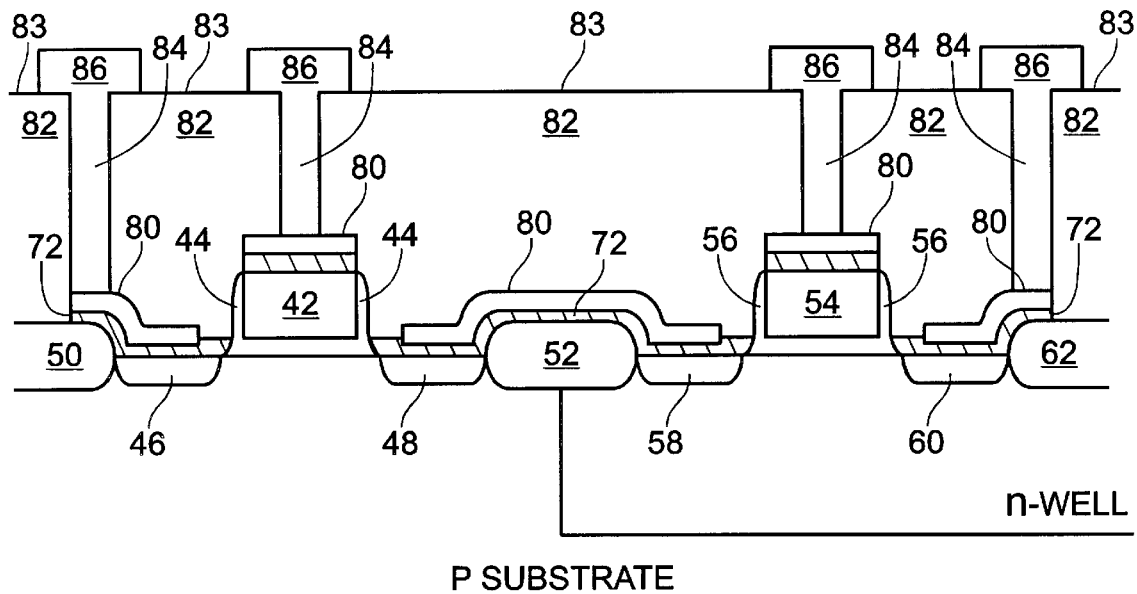

FIG. 11 depicts transistors 38 and 40 of FIG. 10 following the deposition of a dielectric interlevel 82. Dielectric interlevel 82 has a top surface 83, and overlies source/drain areas 46, 48, 58, and 60. Dielectric interlevel 82 also overlies surrounding the field oxide regions 50, 52, and 60. Contact holds 84 are patterned through dielectric interlevel 82 from dielectric inner level surface 83 to silicide film 80 overlying selected adjoining areas of field oxide 50 and 62. Metal 86 is deposited in contact holds 84 to form electrical interconnects from dielectric interlevel surface 83, with silicide film 80, to source/drain regions 77.

Figure 12:
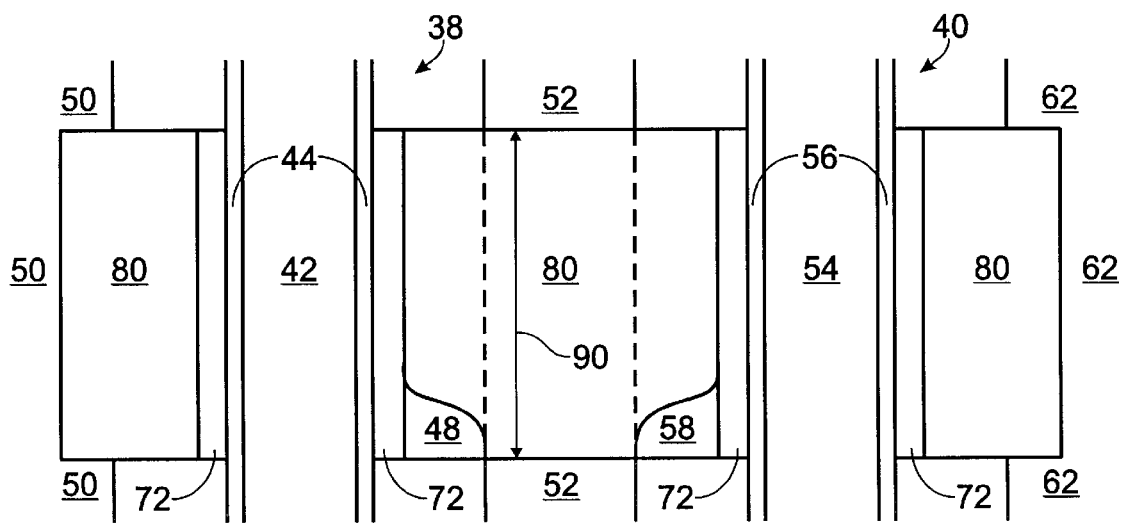

FIG. 12 is a plan view of transistors 38 and 40 of FIG. 10. The plan view is presented to highlight a strap interconnection between first 38 and second 40 CMOS transistors. The field oxide region 52 intervenes between first electrode 58 of second transistor 40, such as a source, and second electrode 48 of first transistor 38, such as a drain. Cut-outs through silicide film 80 show underlying electrodes 48 and 58. The method is applicable to connect a source, drain, or gate electrode of a transistor to the source, drain, or gate electrode of any other transistor. The method is especially useful in fabricating SRAM configurations to reduce cell size. At shown in FIGS. 3 through 10, and described above, silicide film 80 overlies first electrode 58 of second transistor 40 to second electrode 48 of first transistor 38 and selected areas of intervening field oxide region 52. That is, silicide film 80 overlies first electrode 48, through selected areas of intervening field oxide region 52, to said second electrode 48. Silicide film 80 is formed by depositing a layer semiconductor film 72 over transistors 38 and 40 and intervening field oxide region 52. Then, insulating layer 74 is deposited over semiconductor film 72 and anisotropically etched to form second gate electrode sidewalls 76. A refractory metal layer 78 overlies transistors 38 and 40, and selected areas of intervening field oxide 52. Transistors 38 and 40 are annealed to form silicide film 80. Etching is performed to remove unreacted refractory metal 78, second sidewalls 76, and semiconductor film 72 overlying first oxide sidewalls 44 and 56. In this manner, electrical connections are made from first transistor 38 to second transistor 40 across intervening field oxide region 52.

Returning to FIG. 12, silicide film 80 has a width 90 that varies in different aspects of the invention. FIG. 12 depicts width 90 as being approximately equal to the width of source/drain areas 46, 48, 58, and 60. Alternately, refractory metal 78 is deposited over selected areas of source/drain areas 46, 48, 58, and 60 to form a narrower width 90 (not shown). Strap interconnections are not limited to connection between the source of a first transistor and the drains of a second transistor. Connections, as described above, are made between any transistor active area to any other active area on the same metal level. Likewise, multiple transistors are connected in some aspects of the invention, and the present invention connection is also used in both strap and via connection combinations.

Figure 13:
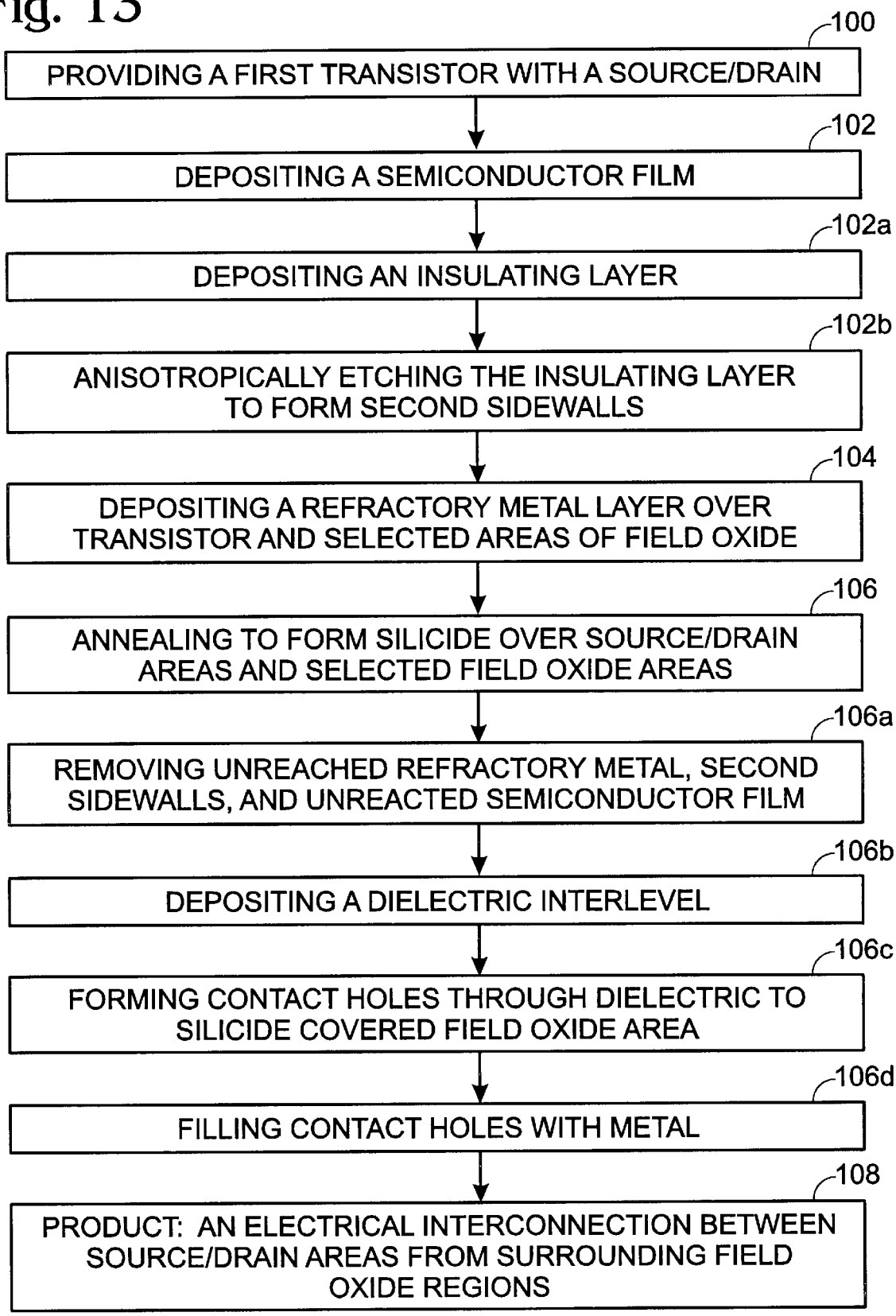
FIG. 13 is a flowchart illustrating a method for forming CMOS interconnections through surrounding field oxide regions.

FIG. 13 is a flowchart illustrating a method for forming CMOS interconnections through surrounding field oxide regions. The interconnection method is applicable to transistors selected from the group consisting of bulk silicon, silicon on insulator (SOI), and raised source/drain the transistors. Step 100 in provides at least a first transistor with source/drain regions. Step 102 deposits a semiconductor film overlying the transistor, including the source/drain regions of the transistor and the surrounding field oxide regions. Step 102 includes the semiconductor film being selected from the group consisting of polysilicon and silicon-germanium compounds $Si_xGe_{1-x}$. In some aspects of the invention, the (x) of $Si_xGe_{1-x}$ is in the range between 0.5 and 0.9. Step 102 includes the semiconductor film having a thickness in the range between 50 and 200 nm.

Step 104 deposits a refractory metal layer overlying the semiconductor film, covering the semiconductor film which has previously been deposited over the source/drain regions and selected adjoining areas of field oxide. The refractory metal is selected from the group consisting on Ti, Co, W, Pt, and Ni. Step 106 anneals the semiconductor film deposited in Step 102 and refractory metal deposited in Step 104 to form a silicide film overlying the source/drain regions and the selected adjoining areas of field oxide. The silicide layer has a thickness in the range between 40 and 200 nm, and a resistivity in the range between 2 and 10 ohms per square inch. Generally, a thicker silicide layer results in lower resistivity. Step 108 is a product, where an electrical interconnection is made between the source/drain regions from the surrounding field oxide region to minimize the size of the source/drain regions.

In some aspects of the invention, a step (not shown) proceeds step 102 of forming a gate electrode with an underlying gate oxide layer and first oxide sidewalls. The gate electrode and overlies portions of the source/drain regions. Then, step 104 includes depositing a semiconductor film overlying the gate electrode and first oxide sidewalls.

In some aspects of the invention further steps follow Step 102. Step 102*a* deposits a layer of insulator, selected from the group consisting of silicon oxide (oxide) and silicon nitride (nitride), overlying the semiconductor film. Step 102*b* anisotropically etches the insulator deposited in Step 102*a* to remove the insulator on the source/drain regions, gate electrode, and surrounding field oxide region, but not the gate electrode sidewalls. In this manner, second sidewalls are formed. Then, Step 104 includes depositing a refractory metal layer overlying the gate electrode and second sidewalls. Step 106 includes annealing the transistor to form a silicide film overlying the transistor in the regions where the semiconductor film was exposed in Step 102*b* including the gate electrode, but not the second sidewalls.

In some aspects of the invention the first sidewalls, the second sidewalls of Step 102*b*, and the intervening semiconductor film deposited in Step 102 have a combined sidewall thickness. Then, a further step follows Step 102b. Step 102c (not shown) dopes and anneals the source/drain regions to form active source/drain regions with source/drain widths approximately twice as wide as the combined sidewall thickness overlying the source/drain regions.

In some aspects of the invention, further steps follow Step 106. Step 106a removes unreacted refractory metal overlying the second sidewalls, the second sidewalls themselves, and the semiconductor film overlying the first oxide sidewalls. When the insulator deposited in Step 102a is oxide, Step 106a includes using a buffered hydrochloride (BHF) to etch the second gate electrode sidewalls. When the insulator deposited in Step 102b is nitride, Step 106a includes using phosphoric acid to etch the second gate electrode sidewalls. A $NH_3OH:H_2O_2:H_2O$ solution is used to remove the semiconductor film.

Step 106b deposits a dielectric interlevel, with a top surface, overlying a transistor. Step 106c etches the dielectric interlevel to form contact holes from the dielectric interlevel top surface to the silicide film overlying the selected areas of field oxide. Step 106d deposits metal in the contact holes to form electrical interconnects from the surface of the dielectric interlevel to the source/drain regions. In this manner, an interconnection is made without regard to the size of the source/drain regions.

In some aspects of the invention, Step 106 includes two annealing sub-steps (not shown). The first Sub-step includes annealing at a temperature in the range between 450 and 650 degrees C. The second Sub-step includes annealing at a temperature in the range between 700 and 900 degrees C.

Figure 14:
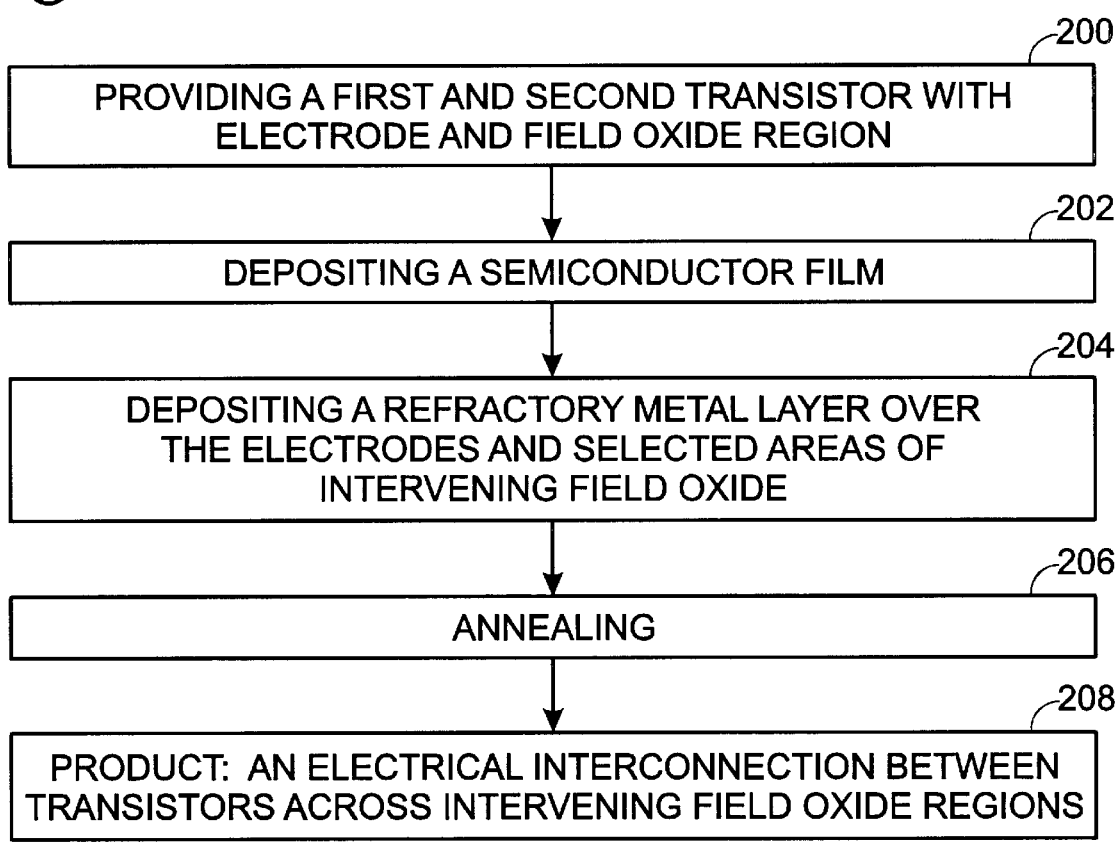
FIG. 14 is a flowchart illustrating a method of forming a strap interconnection between transistors across a field oxide region.

FIG. 14 is a flowchart illustrating a method of forming a strap interconnection between transistors across a field oxide region. Step 200 includes at least a second transistor with a first electrode, such as a source region, a first transistor with a second electrode, such as a drain, and a field oxide region which at least partially surrounds the two transistors. The method is not limited to connecting a source to a drain. The method is applicable to connect the source, drain, and gate electrodes of one transistor to the source, drain, and gate electrodes of any other transistor. Step 202 deposits semiconductor film over the transistors, including the first electrode of the second transistor, the second electrode of the first transistor, and surrounding field oxide regions. Step 204 deposits a refractory metal layer overlying the semiconductor film, including the semiconductor film that has previously been deposited on, and covers the first and second electrodes and selected areas of field oxide intervening between the two transistors. That is, a field oxide region intervening between the first electrode of the second transistor and the second electrode of the first transistor. Step 206 anneals the semiconductor film deposited in Step 202 and the refractory metal deposited in Step 204 to form a silicide film over the first electrode of the second transistor, the second electrode of the first transistor, and the selected areas of intervening field oxide. The product, Step 208 is an electrical connection made from the first transistor to the second transistor across the intervening field oxide. Alternately, a strap connection can be made to any active area of a first transistor to any active area of a second transistor. Further, a strap connection is made to more than two transistor active areas in some aspects of the invention.

In a variation of the above-described interconnection and interconnection method, a silicide film is formed between a gate electrode of a first transistor and an electrode of a second transistor. Then, an area of gate electrode not adjoining the first transistor's source/drain regions is chosen for the connection. A second sidewall is not formed at this chosen connection site so that a silicide film is formed extending from the gate electrode, over the first sidewall, and across an adjoining field oxide region to the second transistor electrode.

An transistor interconnection that permits small source/drain surface areas has been provided. The interconnection is applicable to both strap and via type connections. The surface area of the source/drain regions are extended into neighboring field oxide regions by forming a silicide film from the source/drain regions to the field oxide. Interconnections on the same metal level, or to another metal level are made by an electrical contact to the silicide covered field oxide. The source/drain regions need only be large enough to accept the silicide film. Transistors with small source/drain regions have smaller drain leakage currents and less parasitic capacitance. Other variations and embodiments of the present invention will occur to those skilled in the art.

What is claimed is:

1. A method for forming interconnections from at least a first transistor with source/drain regions, through surrounding field oxide regions, using gate electrode second sidewall structures, the method comprises the steps of:

a) forming a gate electrode, with an underlying gate oxide layer and first oxide sidewalls, overlying portions of the source/drain regions;

b) depositing a semiconductor film overlying the transistor, including the source/drain regions, the gate electrode, the first oxide sidewalls, and the surrounding field oxide regions;

c) depositing a layer of insulator overlying the first semiconductor film;

d) anisotropically etching the insulator deposited in Step c) to remove the insulator on the source/drain regions, gate electrode, and surrounding field oxide region, but not from the gate electrode sidewalls, whereby second sidewalls are formed;

e) depositing a refractory metal layer overlying the semiconductor film, covering the source/drain regions and selected adjoining areas of field oxide; and f) annealing the semiconductor film deposited in Step b) and the refractory metal deposited in Step e) to form a silicide film overlying the source/drain regions and the selected adjoining areas of field oxide, whereby an electrical interconnection is made to the source/drain regions from the surrounding field oxide region to minimize the size of the source/drain regions.

2. A method as in claim 1
in which Step e) includes depositing a refractory metal layer overlying the gate electrode and second sidewalls;
in which Step f) includes annealing the transistor to form a silicide film overlying the transistor in the regions where the first semiconductor film was exposed in Step d) including the gate electrode, but not the second sidewalls.

3. A method as in claim 2 including a further step, following Step f), of:

g) removing unreacted refractory metal overlying the second sidewalls, the second sidewalls themselves, and semiconductor film overlying the first oxide sidewalls.

4. A method as in claim 3 including the further steps, following Step g), of:

h) depositing a dielectric interlevel with a top surface overlying the transistor;

i) etching the dielectric interlevel to form contact holes from the dielectric interlevel top surface to the silicide film overlying the selected areas of field oxide; and j) depositing metal in the contact holes to form electrical interconnects from the surface of the dielectric interlevel to the source/drain regions, whereby an interconnect is made without regard to the size of the source/drain regions.

5. A method as in claim 1 in which Step b) includes the semiconductor film being selected from the group consisting of polysilicon and $Si_xGe_{1-x}$.

6. A method as in claim 5 in which (x), of $Si_xGe_{1-x}$, is in the range between 0.5 and 0.9.

7. A method as in claim 1 wherein the transistor is selected from the group consisting of bulk silicon, silicon on insulator (SOI), and raised source/drain transistors.

8. A method as in claim 1 in which Step b) includes depositing a semiconductor film having a thickness in the range between 50 and 200 nanometers (nm).

9. A method as in claim 3 in which Step c) includes depositing an insulator selected from the group consisting of oxide and nitride.

10. A method as in claim 9 in which Step c) includes depositing an oxide insulator, and in which Step d) includes using a buffered hydrofluoride (BHF) etch to remove the second gate electrode oxide sidewalls, and $NH_3OH:H_2O_2:H_2O$ solution to remove the semiconductor film.

11. A method as in claim 9 in which Step c) includes depositing a nitride insulator, and in which Step g) includes using phosphoric acid to remove the second gate electrode oxide sidewalls, and $NH_3OH:H_2O_2:H_2O$ solution to remove the first semiconductor film.

12. A method as in claim 1 in which Step e) includes a refractory metal selected from the group consisting of Ti, Co, W, Pt, and Ni.

13. A method as in claim 1 in which Step f) includes forming a silicide layer having a thickness in the range between 40 and 200 nm.

14. A method as in claim 1 in which Step f) includes forming a silicide layer having a resistivity in the range between 2 and 10 ohms per square.

15. A method as in claim 1 in which Step f) includes two annealing sub-steps, in which the first Sub-step includes annealing at a temperature in the range between 450 and 650 degrees C., and in which the second Sub-step includes annealing at a temperature in the range between 700 and 900 degrees C.

16. A method as in claim 2 in which the first sidewalls, the second sidewalls of Step d), and the intervening semiconductor film deposited in Step b) have a combined sidewall thickness, and including a further step, following Step d) of:

$d_1$) doping and annealing the source/drain regions to form active source/drain regions with source/drain widths approximately twice as wide as the combined sidewall thickness overlying the source/drain regions.

17. A method for forming a strap interconnection from at least a second transistor with a first electrode to a first transistor with a second electrode across a field oxide region, using gate electrode second sidewall structures, the method comprises the steps of:

a) forming gate electrodes, with underlying gate oxide layers, first oxide sidewalls, and source/drain electrodes;

b) depositing a semiconductor film overlying the transistors, including the first and second electrodes, the first oxide sidewalls, and surrounding field oxide regions;

c) depositing a layer of insulator overlying the semiconductor film;

d) anisotropically etching the insulator deposited in Step c) to remove the insulator on the electrodes, and surrounding field oxide region, but not from the gate electrode sidewalls, whereby the second sidewalls are formed;

e) depositing a refractory metal layer overlying the semiconductor film, covering the first and second electrodes and selected areas of intervening field oxide; and f) annealing the semiconductor film deposited in Step b) and the refractory metal deposited in Step e) to form a silicide film overlying the first electrode of the second transistor, the second electrode of the first transistor, and the selected areas of intervening field oxide, whereby an electrical interconnection is made to from the first transistor to the second transistor across the intervening field oxide.

18. The method as in claim 17 wherein the first and second electrodes are selected from the group consisting of gate, source, and drain electrodes.

19. A method for forming interconnections from at least a first transistor with source/drain regions, through surrounding field oxide regions, using gate electrode second sidewall structures, the method comprises the steps of:

a) forming a gate electrode, with an underlying gate oxide layer and first oxide sidewalls, overlying portions of the source/drain regions;

b) depositing a semiconductor film overlying the transistor, including the source/drain regions, the gate electrode, the first oxide sidewalls, and the surrounding field oxide regions;

c) depositing a layer of insulator overlying the first semiconductor film;

d) anisotropically etching the insulator deposited in Step c) to remove the insulator on the source/drain regions, gate electrode, and surrounding field oxide region, but not from the gate electrode sidewalls, whereby second sidewalls are formed;

e) depositing a refractory metal layer overlying the semiconductor film, covering the source/drain regions, selected adjoining areas of field oxide, and overlying the gate electrode and second sidewalls;

f) annealing the semiconductor film deposited in Step b) and the refractory metal deposited in Step e) to form a silicide film overlying the source/drain regions, the selected adjoining areas of field oxide, and overlying the transistor in the regions where the first semiconductor film was exposed in Step d) including the gate electrode, but not the second sidewalls;

g) removing unreacted refractory metal overlying the second sidewalls, the second sidewalls themselves, and semiconductor film overlying the first oxide sidewalls;

h) depositing a dielectric interlevel with a top surface overlying the transistor;

i) etching the dielectric interlevel to form contact holes from the dielectric interlevel top surface to the silicide film overlying the selected areas of field oxide; and j) depositing metal in the contact holes to form electrical interconnects from the surface of the dielectric interlevel to the source/drain regions, whereby an electrical interconnection is made to the source/drain regions from the surrounding field oxide region to minimize the size of the source/drain regions.

* * * * *